US009620426B2

(12) United States Patent
Izikson et al.

(10) Patent No.: US 9,620,426 B2
(45) Date of Patent: Apr. 11, 2017

(54) METHOD AND SYSTEM FOR PROVIDING PROCESS TOOL CORRECTABLES USING AN OPTIMIZED SAMPLING SCHEME WITH SMART INTERPOLATION

(75) Inventors: Pavel Izikson, Haifa (IL); John Robinson, Austin, TX (US); Daniel Kandel, Aseret (IL)

(73) Assignee: KLA-Tencor Corporation, Milpitas, CA (US)

( * ) Notice: Subject to any disclaimer, the term of this patent is extended or adjusted under 35 U.S.C. 154(b) by 208 days.

(21) Appl. No.: 13/018,729

(22) Filed: Feb. 1, 2011

(65) Prior Publication Data

US 2011/0202298 A1 Aug. 18, 2011

Related U.S. Application Data

(60) Provisional application No. 61/305,615, filed on Feb. 18, 2010.

(51) Int. Cl.
*G01N 37/00* (2006.01)
*H01L 21/66* (2006.01)

(52) U.S. Cl.
CPC ...... *H01L 22/20* (2013.01); *H01L 2924/0002* (2013.01)

(58) Field of Classification Search
CPC .............. G05B 19/41875; H01L 22/20; H01L 2924/0002; H01L 2924/00
USPC .......................................................... 702/83
See application file for complete search history.

(56) References Cited

U.S. PATENT DOCUMENTS

| | | | |
|---|---|---|---|
| 5,719,796 A * | 2/1998 | Chen | H01L 22/20 257/E21.525 |
| 7,295,695 B1 | 11/2007 | Dayal | |
| 7,433,039 B1 * | 10/2008 | Levinski | G03F 7/70616 356/401 |
| 7,445,945 B1 | 11/2008 | Markle et al. | |

(Continued)

OTHER PUBLICATIONS

Chen, Y., Kahng, A., Robins, G., and Zelikovsky, A., Area Fill Synthesis for Uniform Density Layout. IEEE Transactions on Computer-Aided Design of Integrated Circuits and Systems. Oct. 2002. vol. 21:1132-1147.*

(Continued)

*Primary Examiner* — John Breene
*Assistant Examiner* — Stephanie Bloss
(74) *Attorney, Agent, or Firm* — Suiter Swantz pc llo

(57) ABSTRACT

The present invention may include performing a first measurement on a wafer of a first lot of wafers via an omniscient sampling process, calculating a first set of process tool correctables utilizing one or more results of the measurement performed via an omniscient sampling process, randomly selecting a set of field sampling locations of the wafer of a first lot of wafers, calculating a second set of process tool correctables by applying an interpolation process to the randomly selected set of field sampling locations, wherein the interpolation process utilizes values from the first set of process tool correctables for the randomly selected set of field sampling locations in order to calculate correctables for fields of the wafer of the first lot not included in the set of randomly selected fields, and determining a sub-sampling scheme by comparing the first set of process tool correctables to the second set of correctables.

21 Claims, 5 Drawing Sheets

(56) References Cited

U.S. PATENT DOCUMENTS

| | | | |
|---|---|---|---|
| 7,749,666 B2 * | 7/2010 | Gassner et al. | 430/30 |
| 7,873,585 B2 * | 1/2011 | Izikson | 706/21 |
| 7,937,234 B2 * | 5/2011 | St. Pierre et al. | 702/81 |
| 8,175,831 B2 * | 5/2012 | Izikson et al. | 702/83 |
| 2002/0193899 A1 * | 12/2002 | Shanmugasundram | B24B 37/013 700/108 |
| 2004/0169861 A1 * | 9/2004 | Mieher | G01N 21/956 356/400 |
| 2006/0195215 A1 | 8/2006 | Suzuki et al. | |
| 2006/0210893 A1 * | 9/2006 | Van Bilsen | G03F 7/70633 430/30 |
| 2007/0061032 A1 | 3/2007 | Reeves et al. | |
| 2007/0258074 A1 * | 11/2007 | Moest | G03F 9/7011 355/55 |
| 2008/0286885 A1 | 11/2008 | Izikson et al. | |
| 2009/0043527 A1 | 2/2009 | Park et al. | |
| 2009/0063378 A1 | 3/2009 | Izikson | |
| 2009/0287440 A1 | 11/2009 | Kulkarni et al. | |
| 2010/0005442 A1 | 1/2010 | Ghinovker et al. | |

OTHER PUBLICATIONS

Chen et al (Area Fill Synthesis for Uniform Density Layout. IEEE Transactions on Computer-Aided Design of Integrated Circuits and Systems. Oct. 2002. vol. 21:1132-1147. ).*

Chen, Y., Kahng, A.B., Robins, G., and Zelikovsky, A. Area Fill Synthesis for Uniform Layout Density. (Oct. 2002) IEE Transaction on computer-aided design of integrated circuits and system. V21(10), pp. 1132-1147).*

Supplementary European Search Report dated Apr. 4, 2016, European Patent Office, 8 pages.

\* cited by examiner

METHOD AND SYSTEM FOR PROVIDING PROCESS TOOL CORRECTABLES USING AN OPTIMIZED SAMPLING SCHEME WITH SMART INTERPOLATION

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled OPTIMIZED SAMPLING AND SMART INTERPOLATION TO ENABLE FIELD BY FIELD CONTROL IN DEVELOPMENT AND PRODUCTION ENVIRONMENTS, naming Pavel Izikson, Danny Kandel, and John Robinson as inventors, filed Feb. 18, 2010, Application Ser. No. 61/305,615.

TECHNICAL FIELD

The present invention generally relates to a method and system for generating and carrying out a sub-sampling scheme of a semiconductor wafer in concert with an interpolation process.

BACKGROUND

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

Metrology processes are used at various steps during a semiconductor manufacturing process to monitor and control one or more semiconductor layer processes. For example, metrology processes are used to measure one or more characteristics of a wafer such as dimension (e.g., line width, thickness, etc.) of features formed on the wafer during a process step, wherein the quality of the process step can be determined by measuring the one or more characteristics. One such characteristic includes overlay error. An overlay measurement generally specifies how accurately a first patterned layer aligns with respect to a second patterned layer disposed above or below it or how accurately a first pattern aligns with respect to a second pattern disposed on the same layer. The overlay error is typically determined with an overlay target having structures formed on one or more layers of a work piece (e.g., semiconductor wafer). The structures may take the form of gratings, and these gratings may be periodic. If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of semiconductor integrated circuit manufacturing. Conventionally, understanding of the variation across die and wafer are limited to the fixed sampling and hence overlay error is detected only for the known selected sites.

Moreover, if a measured characteristic, such as overlay error, of the wafer is unacceptable (e.g., out of a predetermined range for the characteristic), the measurement of the one or more characteristics may be used to alter one or more parameters of the process such that additional wafers manufactured by the process have acceptable characteristics.

In the case of overlay error, an overlay measurement may be used to correct a lithography process in order to keep overlay errors within desired limits. For example, overlay measurements may be fed into an analysis routine that calculates "correctables" and other statistics, which may be used by the operator in order to better align the lithography tool used in the wafer processing.

There are, however, a number of disadvantages to using metrology processes and tools to measure one or more characteristics of a wafer for process monitoring and control applications. For example, most metrology tools are relatively slow, particularly compared to inspection systems. Therefore, metrology processes are often performed at one location or a limited number of locations on the wafer such that metrology results may be acquired in a relatively expedient manner. However, many processes used to manufacture semiconductor devices produce wafers that have characteristic(s) that vary across the surface of the wafers. As such, using metrology measurements performed at one location or a limited number of locations on a wafer may not provide sufficient information about the characteristic(s) of the wafers such that the process can be accurately monitored and controlled. Therefore, the sampling plan of the metrology process can significantly affect the meaningfulness and usefulness of the metrology results.

Accordingly, it may be desirable to provide a method and/or system which provide a more efficient sampling scheme, allowing for fewer measurements of a selected wafer, while mitigating the loss of measurement information by utilizing an approximation method to provide adequate correctable information for unmeasured sampling locations.

SUMMARY

A method for providing process tool correctables using a sub-sampling scheme with smart interpolation is disclosed. In one aspect, a method may include, but is not limited to, performing a first measurement on a wafer of a first lot of wafers via an omniscient sampling process, wherein the omniscient sampling process includes measuring one or more parameter values at each measurement location of each field of the first wafer, calculating a first set of process tool correctables utilizing one or more results of the measurement performed via the omniscient sampling process, wherein each of the set of process tool correctables is calculated for each field of the wafer of the first lot of wafers, analyzing a process tool correctable signature across the wafer of the first lot of wafers by applying wavelet analysis to the first set of process tool correctables, and determining a sub-sampling scheme utilizing the analyzed process tool correctable signature, wherein the sub-sampling scheme includes a set of field locations of the wafer and a set of measurement locations within each field of the wafer.

In another aspect, a method may include, but is not limited to, performing a first measurement on a wafer of a first lot of wafers via an omniscient sampling process, calculating a first set of process tool correctables utilizing one or more results of the measurement performed via the omniscient sampling process, randomly selecting a set of field sampling locations of the wafer of a first lot of wafers, calculating a second set of process tool correctables by applying an interpolation process to the randomly selected set of field sampling locations, wherein the interpolation process utilizes values from the first set of process tool correctables for the randomly selected set of field sampling locations to calculate process tool correctables for fields of the wafer of the first lot of wafers not included in the set of randomly selected fields, and determining a sub-sampling scheme by comparing the first set of process tool correctables to the second set of process tool correctables, wherein the sub-sampling scheme includes a set of field locations of the wafer and a set of measurement locations within each field of the wafer.

A system for providing process tool correctables using a sub-sampling scheme with smart interpolation is disclosed. In one aspect, the system may include, but is not limited to, a measurement system configured to perform one or more measurements on a semiconductor wafer, and one or more computer systems configured to: calculate a first set of process tool correctables utilizing one or more results of a measurement performed by the measurement system via an omniscient sampling process on a wafer of a first lot of wafers, randomly select a set of field sampling locations of the wafer of the first lot of wafers, calculate a second set of process tool correctables by applying an interpolation process to the randomly selected set of field sampling locations, and determining a sub-sampling scheme by comparing the first set of process tool correctables to the second set of process tool correctables, wherein the sub-sampling scheme includes a set of field locations of the wafer and a set of measurement locations within each field of the wafer.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1B:
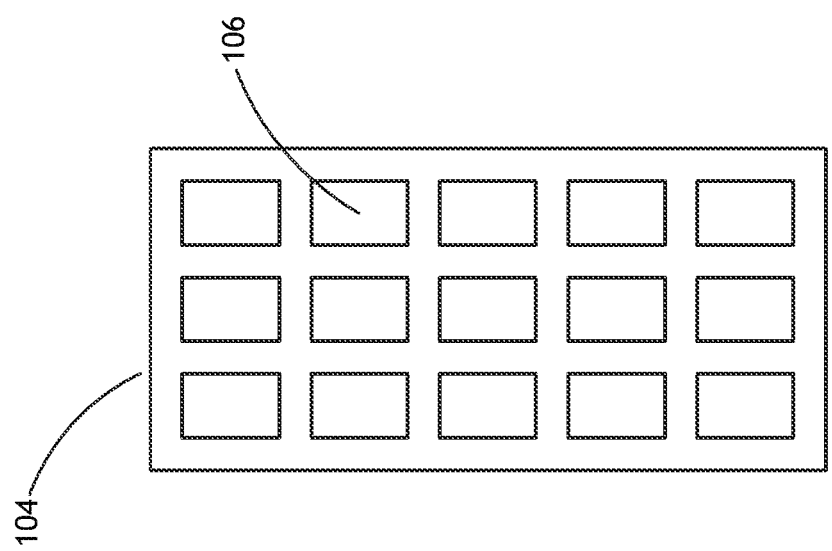
FIG. 1B illustrates a top plan view of an individual field of a semiconductor wafer showing a plurality of targets within the field.

Reference will now be made in detail to the subject matter disclosed, which is illustrated in the accompanying drawings.

Referring generally to FIGS. 1A through 5, a method and system for providing process tool correctables using a sub-sampling scheme with smart interpolation is described in accordance with the present disclosure. Employing an optimized metrology sampling scheme combined with an interpolation process may improve semiconductor wafer process tool correction. Conventionally, a metrology process, such as overlay metrology or critical dimension (CD) metrology, is carried out at fixed locations of a semiconductor wafer. These metrology measurements may then be used to calculate corrections, known as "correctables," used to correct an associated process tool used to perform a given process on the semiconductor wafer. These correctables include overlay correctables, dose correctables, and focus correctables. The present invention is directed at a method and system for providing an approximated set of process tool correctables created via a sub-sampling scheme (e.g., optimized, enhanced, or reduced metrology sampling scheme) utilized in concert with an interpolation process (e.g., wavelet analysis, spline interpolation, polynomial interpolation, or neural network interpolation). The interpolation process allows for the approximation of process tool correctables at unmeasured fields of a tested semiconductor wafer. The combination of fewer measurement locations, due to the sub-sampling scheme, along with the interpolation process, allows a user to gather acceptably accurate process tool correctable information more efficiently, thereby increasing throughput of a semiconductor fabrication process.

As used throughout the present disclosure, the term "wafer" generally refers to a substrate formed of a semiconductor or non-semiconductor material. For example, a semiconductor or non-semiconductor material include, but are not limited to, monocrystalline silicon, gallium arsenide, and indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed.

A typical semiconductor process includes wafer processing by lot. As used herein a "lot" is a group of wafers (e.g., group of 25 wafers) which are processed together. Each wafer in the lot is comprised of many exposure fields from the lithography processing tools (e.g. steppers, scanners, etc.). Within each field may exist multiple die. A die is the functional unit which eventually becomes a single chip. On product wafers, overlay metrology marks are typically placed in the scribeline area (for example in the 4 corners of the field). This is a region that is typically free of circuitry around the perimeter of the exposure field (and outside the die). In some instances, overlay targets are placed in the streets, which are regions between the die but not at the perimeter of the field. It is fairly rare for overlay targets to be placed on product wafers within the prime die areas, as this area is critically needed for circuitry. Engineering and characterization wafers (not production wafers), however, typically have many overlay targets throughout the center of the field where no such limitations are involved. Because of the spatial separation between the "scribe-line" metrology marks and the prime die circuitry, there occur discrepancies between what is measured and what needs to be optimized on product wafers. Advances in both the scribe-line metrology marks and in their interpretation are required.

One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

Figure 2:
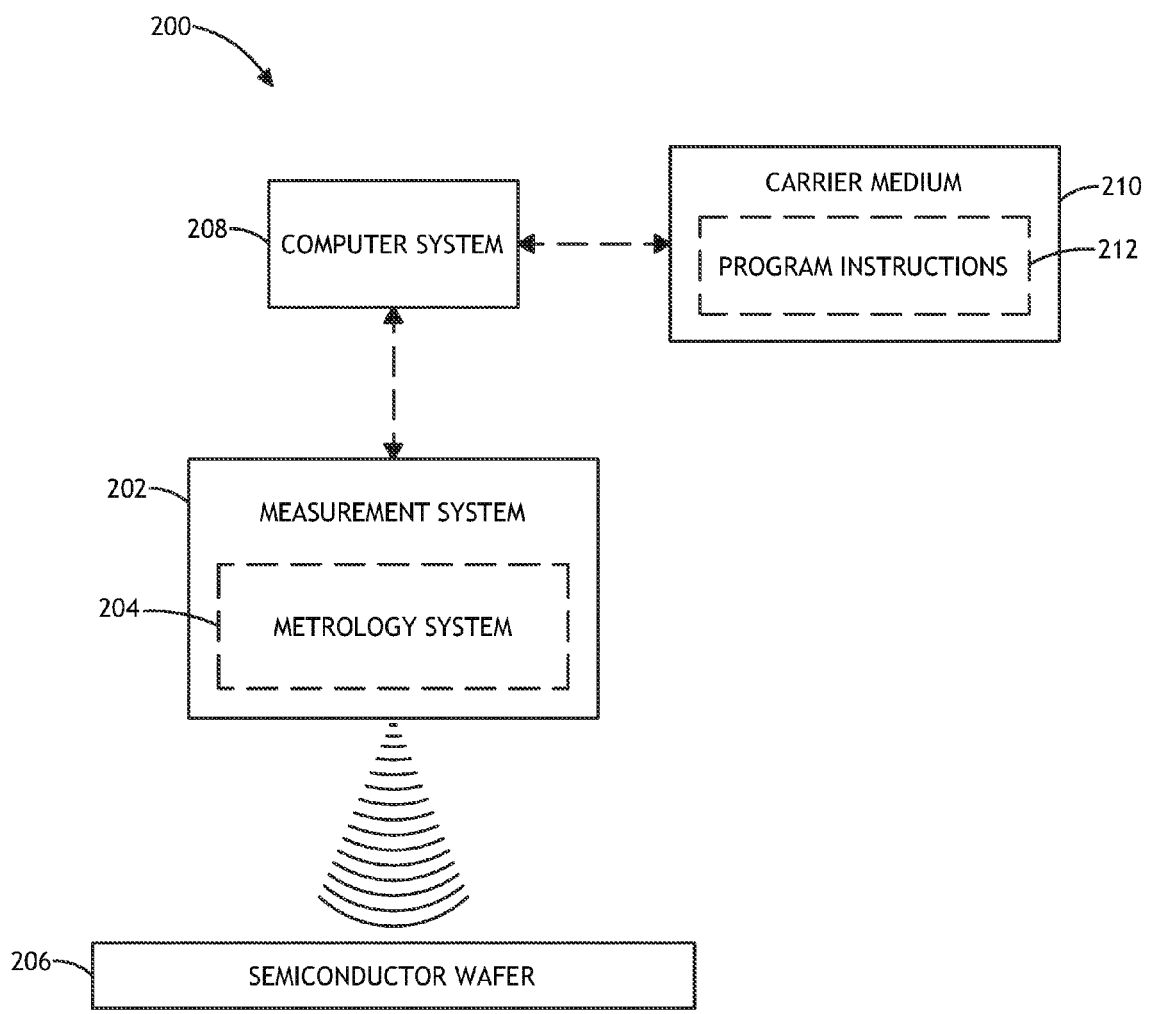
FIG. 2 is a block diagram illustrating a system for providing process tool correctables using a sub-sampling scheme with smart interpolation, in accordance with one embodiment of the present invention.

FIG. 2 illustrates a system 200 for providing process tool correctables using a sub-sampling scheme with smart interpolation. In one embodiment, the system 200 may include a measurement system 204, such as a metrology system 204 configured to perform overlay metrology or CD metrology at identified locations of the semiconductor wafer 204. The metrology system 204 may include any appropriate metrology system known in the art, such as, but not limited to, a metrology system suitable for critical dimension metrology. In a further embodiment, the metrology system 204 may be configured to accept instructions from another subsystem of the system 200 in order to carry out a designated metrology plan. For instance, the metrology system 204 may accept instructions from one or more computer systems 208 of the system 200. Upon receiving the instructions from the computer system 208, the metrology system 204 may perform overlay metrology or CD measurements at the locations of the semiconductor wafer 206 identified in the provided instructions. As will be later discussed, the instructions provided by the computer system 208 may include a sub-sampling plan, which may be inputted into the metrology tool 204 in order to measure a selected sub-set of the available measurement locations on a semiconductor wafer 206.

In one aspect, one or more computer systems 208 of the system 200 may be configured to generate a sub-sampling scheme based on an analysis of an omniscient sampling of a test wafer of a first lot. In one embodiment, the one or more computer systems 208 may be configured to receive a set of measurements performed by the measurement system 202 (e.g., metrology system 204) in an omniscient sampling process of one or more wafers of a test lot. The one or more computer systems 208 may further be configured to calculate a set of process tool correctables using the received measurements from an omniscient sampling process. Moreover, the one or more computer systems 208 may then use these calculated results to analyze the process tool correctable signature across the wafer. Then, the one or more computer systems 208 may determine a sub-sampling scheme utilizing the analyzed correctable signature, wherein the sub-sampling scheme is configured to minimize the difference between the correctable values in the full sampling process and the correctable values in the combined sub-sampling and modeling process.

In an alternative embodiment, the one or more computer systems 208 may be configured to randomly select a set of field locations of a wafer of a test lot of wafers. Using these randomly selected locations, the computer system 208 may then calculate a modeled set of process tool correctables by inputting calculated correctable values derived from an omniscient sampling process into an interpolation algorithm for the randomly selected locations. The interpolation algorithm may then approximate the process tool correctables for fields of the wafer which are not included in the randomly selected set of field sampling locations. Then, the modeled set of process tool correctables (i.e., the interpolated correctable values and the correctable values taken from the random location selection) may be used by the computer system 208 to compare to the set of process tool correctables taken in the omniscient sampling process. In a further embodiment, the computer system 208 may then determine a sub-sampling scheme by determining which set of randomly generated locations best minimizes the difference between the modeled correctables and the calculated correctables obtained via omniscient sampling. In another embodiment, the computer system 208 may determine a sub-sampling scheme by determining which set of randomly generated locations reduces the difference between the modeled correctables and the calculated correctables obtained via omniscient sampling below a selected threshold level.

It should be recognized that the steps described above may be carried out by a single computer system 208 or, alternatively, a multiple computer systems 208. Moreover, different subsystems of the system 200, such as the metrology system 204, may include a computer system suitable for carrying out at least a portion of the steps described above. Therefore, the above description should not be interpreted as a limitation on the present invention but merely an illustration.

In another embodiment, the one or more computer systems 208 may then transmit instructions to the measurement system 202 (e.g., metrology system 204) which are indicative of the generated sub-sampling scheme. Moreover, the computer system 208 may be configured to generate the sampling scheme according to any of the embodiments described herein.

In another embodiment, the one or more computer systems 208 may transmit instructions to one or more process tools which are indicative of a modeled set of process tool correctables. Further, the transmitted instructions may contain information indicative of overlay, focus, and dose correctables. Moreover, the one or more computer systems 208 may be configured to perform any other step(s) of any of the method embodiments described herein.

In another embodiment, the computer system 208 may be communicatively coupled to the measurement system 202 or another process tool in any manner known in the art. For example, the one or more computer systems 208 may be coupled to a computer system of a measurement system 202 (e.g., computer system of a metrology system 204) or to a computer system of a process tool. In another example, the measurement system 202 and another process tool may be controlled by a single computer system. In this manner, the computer system 208 of the system 200 may be coupled to a single metrology-process tool computer system. Moreover, the computer system 208 of the system 200 may be configured to receive and/or acquire data or information from other systems (e.g., inspection results from an inspection system, metrology results from a metrology system, or process tool correctables calculated from a system, such as KLA-Tencors KT Analyzer) by a transmission medium that may include wireline and/or wireless portions. In this manner, the transmission medium may serve as a data link between the computer system 208 and other subsystems of the system 200. Moreover, the computer system 208 may send data to external systems via a transmission medium. For instance, the computer system 208 may send a generated sub-sampling scheme or process tool correctables to a separate metrology system, which exists independently of the described system 200.

A method and system for generating and providing an optimized sampling scheme using overlay measurements in the context of a computer system is described generally in U.S. patent application Ser. No. 12/107,346, filed on Apr. 22, 2008, and is incorporated herein by reference.

The computer system 208 may include, but is not limited to, a personal computer system, mainframe computer system, workstation, image computer, parallel processor, or any other device known in the art. In general, the term "computer system" may be broadly defined to encompass any device having one or more processors, which execute instructions from a memory medium.

Program instructions 212 implementing methods such as those described herein may be transmitted over or stored on carrier medium 210. The carrier medium may be a transmission medium such as a wire, cable, or wireless transmission link. The carrier medium may also include a storage medium such as a read-only memory, a random access memory, a magnetic or optical disk, or a magnetic tape.

The embodiments of the system 200 illustrated in FIG. 2 may be further configured as described herein. In addition, the system 200 may be configured to perform any other step(s) of any of the method embodiment(s) described herein.

Figure 3:
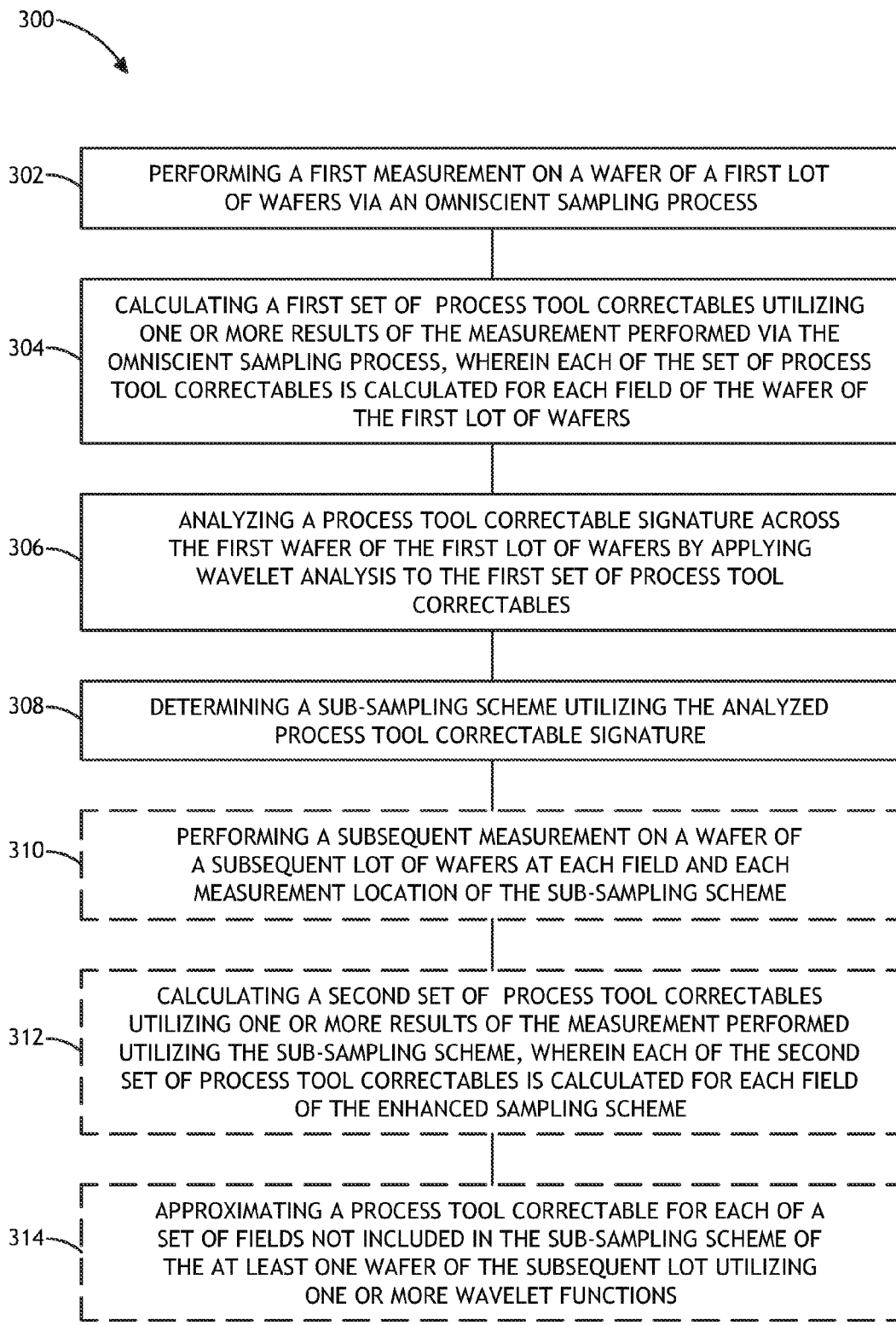
FIG. 3 is a flow diagram illustrating a method for providing process tool correctables using a sub-sampling scheme with smart interpolation, in accordance with one embodiment of the present invention.

FIG. 3 is a flow diagram illustrating steps performed in a method for providing process tool correctables using a sub-sampling sampling scheme with smart interpolation.

In a first step 302, a first measurement may be performed on at least a first wafer of a first lot of wafers using an omniscient sampling process. The omniscient sampling process may include measuring one or more parameter values at each measurement location of each field of the first wafer of the first lot of wafers.

In one embodiment, the first measurement may include a metrology process. The metrology process may include any measurement process described herein, including, but not limited to, overlay measurements, CD measurements, dose measurements, or focus measurements.

In one embodiment, the measured parameter value may include any quantity that may be measured utilizing a metrology measurement process. For example, the measured parameter value, may include, but is not limited to overlay error, CD values (e.g., CD line width, feature shape, profile information, and the like), dose, or focus.

In one embodiment, the method includes performing the measurements on one or more wafers in at least one lot of wafers at all measurement spots on the one or more wafers. This step is referred to herein as "omniscient sampling." In one embodiment, all of the measurement spots include all fields 104 on one or more wafers 102. For example, as shown in FIG. 1, wafer 102 has fields 104 formed thereon. Although a particular number and arrangement of fields 104 on wafer 102 are shown in FIG. 1, the number and arrangement of fields on the wafer may vary depending on, for example, the device being formed on the wafers. The measurements may be performed at all of fields 104 formed on wafer 102 and at all of the fields on other wafers in at least one lot. For example, the measurements may be performed at least once per field formed on all of the wafers in at least one lot. The measurements may be performed on device structures formed in the fields and/or on test structures formed in the fields. In addition, the measurements performed in each of the fields may include all of the measurements performed during the metrology process (e.g., one or more different measurements).

Figure 1A:
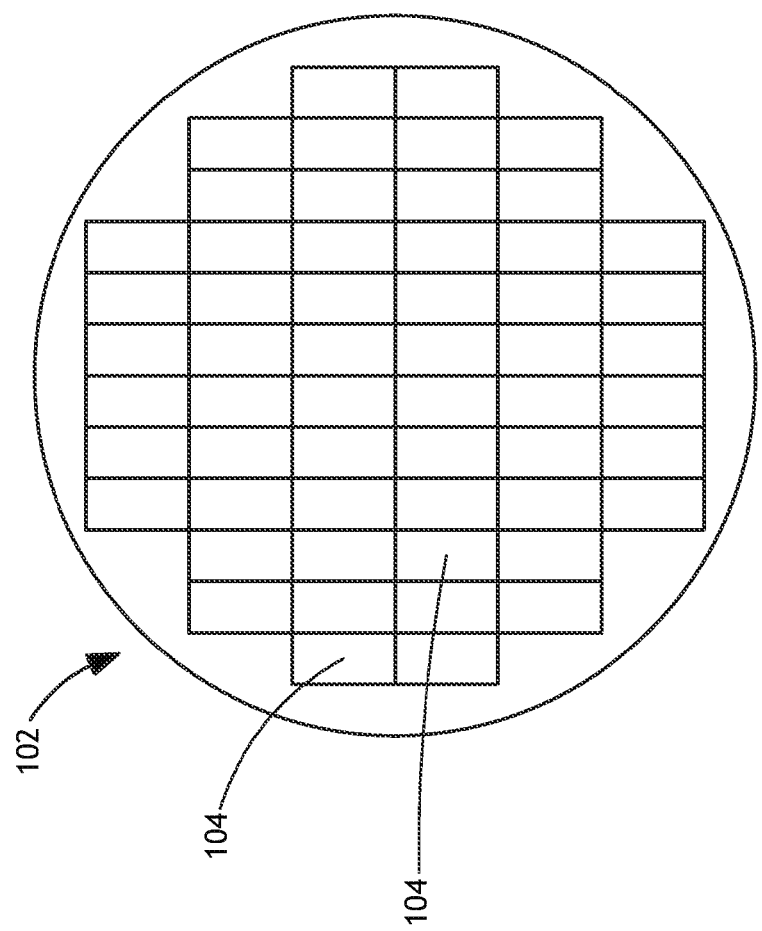
FIG. 1A illustrates a top plan view of a semiconductor wafer with demarked fields.

In another embodiment, all of the measurement spots measured in an omniscient sampling process may include all targets on the wafers in at least one lot. For example, as shown in FIG. 1A, field 104 formed on a wafer 102 may include targets 106. Although a particular number and arrangement of targets 106 in field 104 are shown in FIG. 1B, the number and arrangement of targets 106 in the fields 104 may vary depending on, for example, the device being formed on the wafer 102. Targets 106 may include device structures and/or test structures. In this embodiment, therefore, the measurements may be performed on all of targets 106 formed in each field 104. In addition, the measurements may be performed at least once per target formed in field 104. The measurements may also include all of the measurements that are performed during the metrology process (e.g., one or more different measurements).

In another embodiment, all of the measurement spots include all fields and all targets on the wafers in at least one lot. For example, each of fields 104 shown formed on wafer 102 in FIG. 1A may include one or more targets such as targets 106 shown in FIG. 1B. Therefore, the measurements may be performed on each of the targets 106 in each of the fields 104 formed on each of the wafers 102 in at least one lot.

In another embodiment, the results of the measurements performed in the omniscient sampling step include information about variation in the measurement process. The variation in the measurements may be determined in any manner known in the art (e.g., standard deviation, amount of variation, etc.). Since the variation in the measurements will generally indicate variations in the process or process excursions, the number of lots of wafers that are measured in the omniscient sampling step may vary depending on the process or the process excursions. As such, although at least one lot is measured in the omniscient sampling step, the number of lots that are measured may be 3 lots, 4 lots, 5 lots, etc. depending on the results of the measurements for each sampled lot. In this manner, the method is started with omniscient sampling of a number of lots in which all wafers and all fields and/or all targets on the wafers are measured, and sources of variation are learned. The sources of variation that are identified or determined in this step may include any sources of variation including, but not limited to, overlay variation, critical dimension (CD) variation, variation in other characteristics of the wafers, lot-to-lot variation, wafer-to-wafer variation, field-to-field variation, side-to-side variation, statistical sources of variation, and the like, or any combination thereof.

Measurement processes and systems suitable for implementation in the present invention are described generally in U.S. patent application Ser. No. 12/107,346, filed on Apr. 22, 2008, which has been incorporated above by reference.

In a second step 304, a first set of process tool correctables may be calculated using the measurement results of step 302. A separate correctable value may be calculated for each field 104 of the wafer, such that for each wafer having N number of fields 104 the method step 304 will calculate N collections of process tool correctables. More specifically the first set of process tool correctables includes N collections of correctables, each group of correctables being calculated for each individual field of the wafer 102.

In one embodiment, overlay or CD metrology data may be used to calculate an overlay correctable, a dose correctable, or a focus correctable for each field 104 of the measured wafer 102. These correctable values may then be sent to a lithography tool to improve the lithography tools performance. In a general sense, the correctable data may be used to correct the alignment of a lithography tool (e.g., stepper) or scanner tool to improve the control of subsequent lithographic patterning with respect to overlay performance. It is important to note that the present invention applies field-by-field analysis of correctables, wherein a table of intrafield correctable values may be calculated for each field 104 of a measured wafer 102.

Traditionally, overlay errors taken from the fields of a wafer may be used to determine a linear overlay function. This linear overlay function may then be used as correctables for an associated process tool, such as a scanner or stepper tool. In addition to linear overlay functions, a high-order nonlinear overlay function may be implemented as an overlay function to calculate the corresponding correctables for a given process tool. For example, an analyzer (e.g., KLA-Tencor's KT Analyzer) may be configured to implement higher order models, which may then be used to input overlay and CD metrology data to calculate correctables on a field-by-field basis across a wafer. The intrafield correctables may include, but are not limited to, overlay correctables, focus correctable, and dose correctables. The associated table of intrafield correctables produced for each field of the measured wafer may include any correctable value known in the art.

Overlay functions used in calculation of process tool correctables are described generally in U.S. Pat. No. 7,876,438, issued on Jan. 25, 2011, and is incorporated herein by reference.

In a third step 306, a process tool correctable signature across the wafer may be analyzed via wavelet analysis. As used herein, the "correctable signature" is a characteristic non-uniform spatial pattern across the wafer. In the present case, the correctable signature is formed by the individual intrafield correctable values calculated for each individual field of the wafer. The intrafield correctable values of each field serve to create a two-dimensional correctable signature across the surface of the wafer.

It is further contemplated that the correctable signature may also be constructed using the intrafield residuals from the higher order overlay model used to model overlay values within each field.

An aspect of the present invention includes analyzing the correctable signature using a wavelet analysis routine. By applying a wavelet analysis routine to the discrete intrafield correctable values of the individual fields of the wafer a continuous correctable signature model may be developed. Phase retrieval algorithms such as wavelet analysis are generally known in the art. Wavelet analysis is generally described in U.S. patent application Ser. No. 11/510,147, filed on Aug. 24, 2006, and U.S. patent application Ser. No. 12/533,295, filed on Jul. 31, 2009, both of which are incorporated herein by reference.

Figure 4:
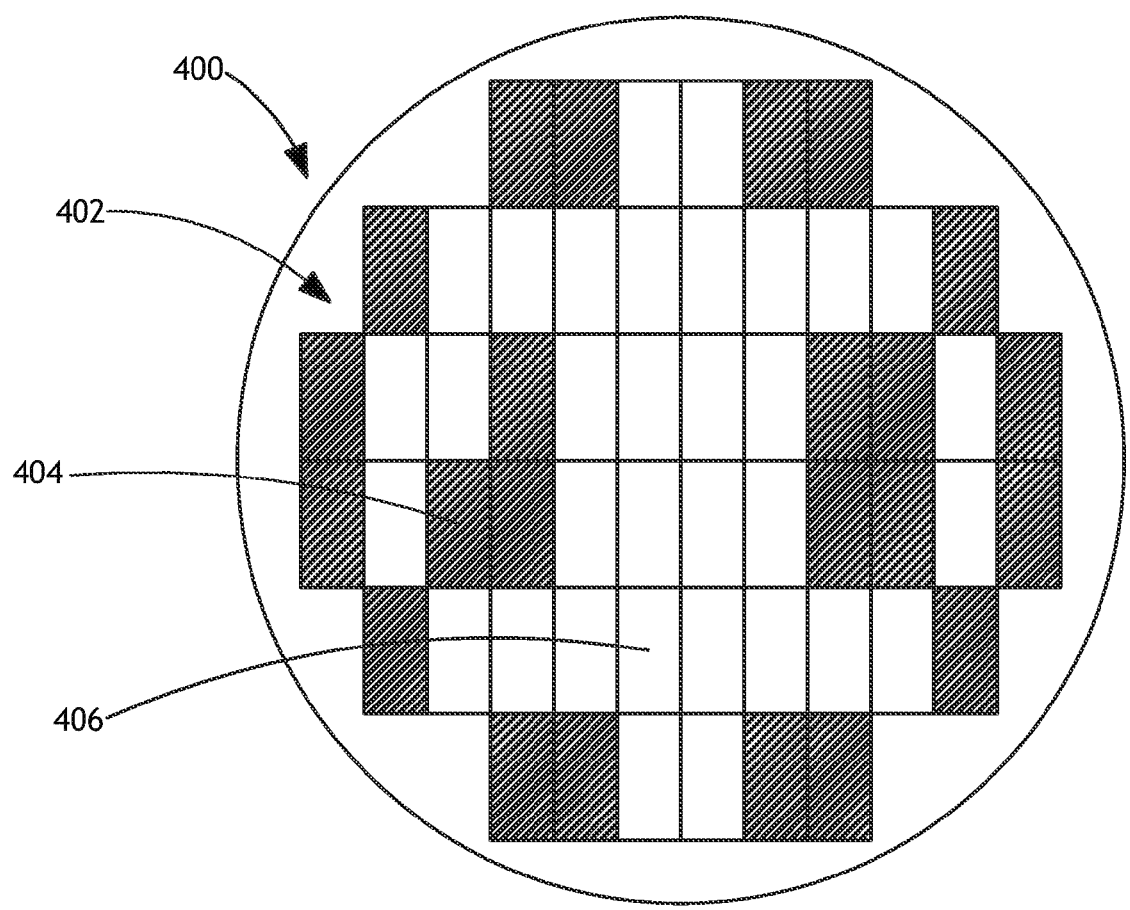
FIG. 4 illustrates an exemplary sub-sampling scheme suitable for implementation in the present invention.

In a fourth step 308, a sub-sampling scheme may be determined by utilizing the analyzed correctable signature of step 306. In one embodiment, the sub-sampling scheme may include a sub-set of the total number of fields of the wafer. For example, as illustrated in FIG. 4, a sub-sampling scheme 402 may include a sub-set of fields 404 of the total number of fields 406 of the wafer 400. With respect to FIG. 4, the shaded regions 404 represent fields included in the sub-sampling scheme, while non-shaded regions 406 represent fields not to be sampled in subsequent lots. As such, the sub-sampling scheme may include fewer to-be sampled fields than the total number of fields of a given wafer. In another embodiment, the sub-sampling scheme may include a sub-set of the total number of measurement spots (e.g., overlay targets) with a single field of the wafer.

In one aspect, selecting the appropriate sub-sampling scheme may include utilizing the analyzed correctable signature of step 306 in order to determine the sub-set of fields and measurement locations of the wafer which are required to be measured in order to match the data values taken in the omniscient sampling process of step 302 to within a selected level of accuracy.

In one embodiment, the sub-sampling scheme may include an optimal sampling scheme. For example, upon comparing analyzing the correctable signature of step 306 an optimal sampling scheme may be determined by determining the optimal number of measurement locations on at least one wafer of a lot of wafers and the locations of those measurements on the wafer. As such, the sub-sampling scheme may include a determined number of measurement locations and locations of the determined number of measurement locations. The optimal sampling scheme in a general sense is the set of sub-set sampling conditions (e.g., location and number of measurement locations) which best minimizes the correctable signature across the measured wafer. It should be recognized by those skilled in the art that optimization of a sub-set sampling scheme may be accomplished using a known technique, including, but not limited to, the D-Optimal method and Federov exchange algorithms.

In another embodiment, the sub-sampling scheme may include an enhanced sampling scheme. In a general sense, an enhanced sampling scheme allows for higher sampling rate than the optimized sampling scheme. In another embodiment, the sub-sampling scheme may include a reduced sampling scheme. In a general sense, reduced sampling scheme provides for a lower sampling rate than the optimized sampling scheme. Optimal, enhanced, and reduced sub-sampling schemes are generally described in U.S. patent application Ser. No. 12/107,346, filed on Apr. 22, 2008, which has been incorporated by reference above.

It should be recognized that determined optimal sub-sampling scheme is not a requirement of the present invention. Rather, only an adequate sub-sampling scheme need be determined for implementation in the present invention. For example, a set level of accuracy may be required in one context of the present invention and the method, therefore, need only provide a sub-sampling scheme which reduces the difference between the correctables of the omniscient sampling and the modeled correctables to a value below this selected level.

It should be further recognized that the sub-sampling plan may be generated in any suitable format. For instance, the file format may be configured such that it may be used by any measurement system or process tool known in the art.

In a further step 310, one or more subsequent measurements may be performed on a wafer of a subsequent lot of wafers at the field and measurement locations provided in the sub-sampling scheme generated in step 308. Measurements performed on one or more wafers of a subsequent lot may include measurements similar to the measurements performed in step 302. In this manner, the various measurements and methods of measurements as outlined in step 302 may be applied to the measurement locations (e.g., the selected fields and measurement locations within each field) supplied to the measurement system via the sub-sampling scheme.

In a further step 312, an additional set of process tool correctables may be calculated for the fields measured on one or more subsequent lots in accordance with the sub-sampling scheme. The additional set of process tool correctables includes an individual intrafield correctable for each measured field of the sub-sampling scheme. In a general sense, the additional set of process tool correctables may be calculated in a manner similar to that outline in step 304 of process 300. Therefore, the calculation methods outline in step 304 may be applied to the measurement values gather from the measurement locations provided in the sub-sampling scheme.

In a further step 314, the process tool correctables for the non-measured fields of a wafer of the subsequent lot may be approximated utilizing one or more wavelet functions. The process tool correctables for measurement locations not included in the sub-sampling scheme may be approximated utilizing known interpolation procedures, such as wavelet functions. The general use of wavelet functions to interpolate data using measured data is described in U.S. patent application Ser. No. 10/260,374, filed on Sep. 26, 2002, and is incorporated herein by reference.

Figure 5:
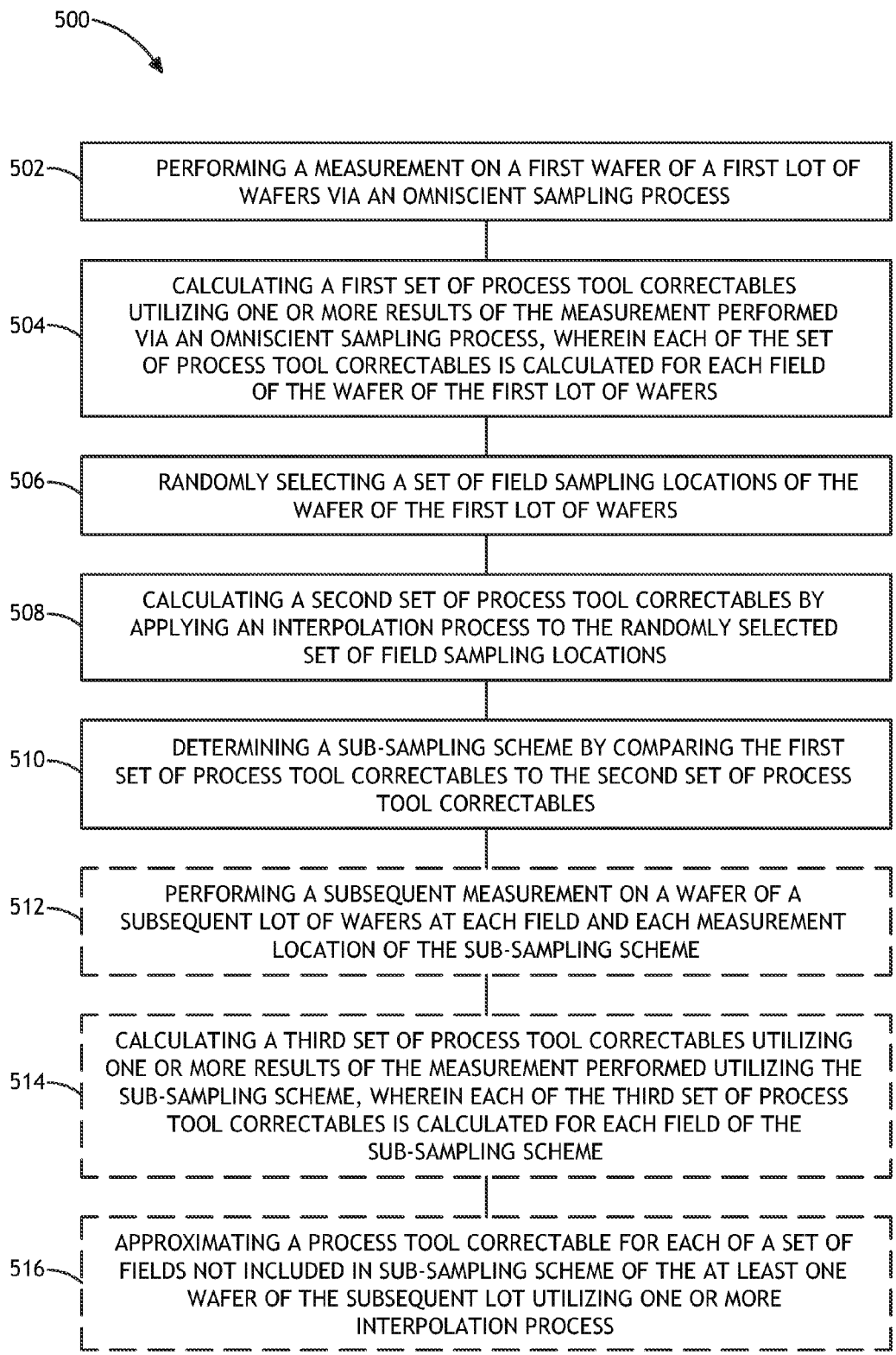
FIG. 5 is a flow diagram illustrating a method for providing process tool correctables using a sub-sampling scheme with smart interpolation, in accordance with one embodiment of the present invention.

FIG. 5 is a flow diagram illustrating steps performed in alternate method for providing process tool correctables using a sub-sampling scheme with smart interpolation.

In a first step 502, in a manner similar to process 300, a first measurement may be performed on at least a first wafer of a first lot of wafers using an omniscient sampling process. The omniscient sampling process may include measuring one or more parameter values at each measurement location of each field of the first wafer of the first lot of wafers. As described above, the measurements performed on one or more wafers of a first lot of wafers may include measurements processes similar to the measurements performed in step 302 and 310 of process 300. In this manner, the various measurements and methods of measurements as outlined in step 302 and 310 may be applied to the omniscient sampling process of the process 500.

In a second step 504, in a manner similar to process 300, a first set of process tool correctables may be calculated using the measurement results of step 502. Procedures and methods described in step 304 of process 300 may be implemented in a similar manner in order to calculate the process tool correctables using the measurement results found in step 502.

In a third step 506, a set of field sampling locations may be randomly generated. In one embodiment, the field sampling locations may be randomly selected in a Monte Carlo simulation process. In one aspect, the number of sampling spots may be preselected, whereas the locations of those sampling spots are randomly generated. Moreover, the number of sampling spots to be sampled may be preselected to reside within a range of sub-sample spots. For example, a user may select the minimum or maximum number of sampling spots to be sampled. Then, after selection of the number of sampling spots or the range of sampling spots, an associated computer system may randomly select the positions of those sub-sampling spots. More specifically, a computer system may randomly select a plurality of fields and measurement spots within the selected fields to be analyzed in the subsequent process step.

In another embodiment, a user may select an additional constraint. For example, the pattern formed by the locations of the sampling spots may be required to have a selected spatial symmetry, such as 180° or 90° rotational symmetry.

It should be noted that the measurement process used to characterize the correctable value associated with the fields generated via a random selection process is found in the omniscient sampling process of 502.

In a fourth step 508, a second set of process tool correctables may be calculated via an interpolation process applied to the randomly selected field sampling locations of step 506. For example, an interpolation process may be utilized to calculate correctable values at non-sampled locations (i.e., locations not selected by random selection of step 506) utilizing the correctable values calculated using a measurement result taken from the randomly selected field locations of step 506.

In one embodiment, the interpolation process may include, but is not limited to, Spline interpolation, polynomial interpolation, or a neural network interpolation process. In a general sense, any interpolation algorithm which is applied to a set of input values to calculate or model a set of output values may be implemented in the present invention.

Examples of modeling used within the context of semiconductor metrology systems are generally described in U.S. Pat. No. 6,704,661; U.S. Pat. No. 6,768,967; U.S. Pat. No. 6,867,866; U.S. Pat. No. 6,898,596; U.S. Pat. No. 6,919,964; U.S. Pat. No. 7,069,153; U.S. Pat. No. 7,145,664; U.S. Pat. No. 7,873,585; and U.S. patent application Ser. No. 12/486,830; all of which are incorporated herein by reference.

In a fifth step 510, a sub-sampling scheme may be determined by comparing the first set of process tool correctables calculated in step 504 using omniscient sampling to the second set of process tool correctables found in step 508 using the combination of sub-sampling and interpolation.

In one embodiment, the comparison between the first set of correctables and second set of correctables may include selecting a sub-sampling scheme which is configured to provide a difference between the first set of process tool correctables and the second set of process tool correctables below a preselected level.

In another embodiment, the comparison between the first set of correctables and second set of correctables may include selecting the sub-sampling scheme which minimizes the difference between the first set of process tool correctables and the second set of process tool correctables. In this manner, the sampling scheme which best minimizes the difference between the first set of correctables and the second set of correctables is the optimal sampling scheme.

Similarly to process 300, an optimal sampling scheme may be selected using a known technique, including, but not limited to, the D-Optimal method and Federov exchange algorithms.

Also as discussed in the context of process 300, the sub-sampling scheme may include an enhanced sampling scheme or a reduced sampling scheme.

In a further step 512, one or more subsequent measurements may be performed on a wafer of a subsequent lot of wafers at the field and measurement locations provided in the sub-sampling scheme generated in step 510. Measurements performed on one or more wafers of a subsequent lot may include measurements similar to the measurements performed in step 302 and 310 of process 300 and step 502 of process 500. In this manner, the various measurements and methods of measurements as outlined in step 302, 310, and 502 may be applied to the measurement locations (e.g., the selected fields and measurement locations within each field) supplied to the measurement system via the sub-sampling scheme.

In a further step 514, a third set of process tool correctable may be calculated utilizing one or more results of the measurement performed in accordance with the sub-sampling scheme. The third set of process tool correctables may be calculated for the fields measured on one or more subsequent lots in accordance with the sub-sampling scheme generated in step 510. The third set of process tool correctables includes an individual intrafield correctable for each measured field of the sub-sampling scheme. In a general sense, the third set of process tool correctables may be calculated in a manner similar to that outline in step 304 and 312 of process 300 and 508 of process 500. Therefore, the correctable calculation methods outlined in steps 304, 312, and 508 may be applied to the measurement values gathered from the measurement locations provided in the sub-sampling scheme.

In a further step 516, the process tool correctables for each of a set of fields not included in the sub-sampling scheme may be approximated utilizing an interpolation process. In one aspect, the interpolation process may use as inputs the third set of process tool correctables calculated for each of the fields of the sub-sampling scheme. The interpolation processes used to approximate the correctables of the fields not included in the sub-sampling scheme are similar to the interpolation process outlined in step 508.

It is further contemplated that the correctables calculated in step 514, which include correctables calculated using measurement process of locations within the sub-sampling scheme, and the correctables approximated in step 516, which include correctables approximated by interpolating across the measure locations not included in the sub-sampling scheme (using the sampled locations as inputs), may be combined into one table. The single correctable table may be collected in any convenient computer file format.

It is further contemplated that the single correctable table described above may then be transmitted to one or more measurement tools or process tools to provide corrections to these systems.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. For example, after the method generates the sub-sampling plan, the method may include storing the sub-sampling plan in a metrology recipe in a storage medium. In addition, results or output of the embodiments described herein may be stored and accessed by a metrology system such as a CD SEM such that a metrology system can use the sub-sampling plan for metrology assuming that the output file can be understood by the metrology system. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A computer implemented method for providing process tool correctables, comprising:
   performing, with a metrology tool, a first measurement on a wafer of a first lot of wafers via an omniscient sampling process, wherein the omniscient sampling process includes measuring one or more parameter values at one or more measurement locations of at least some fields of the first wafer;
   calculating a first set of process tool correctables utilizing one or more results of the measurement performed via the omniscient sampling process, wherein a correctable is calculated for a respective field of the wafer of the first lot of wafers;
   analyzing a process tool correctable signature formed from at least a portion of the first set of process tool correctables across the wafer of the first lot of wafers by applying wavelet analysis to the first set of process tool correctables;
   determining a sub-sampling scheme utilizing the analyzed process tool correctable signature, wherein the sub-sampling scheme includes a set of field locations of the wafer and a set of measurement locations within at least some fields of the wafer, wherein the number of field locations of the sub-sampling scheme is less the number of field locations measured in the omniscient sampling process;
   directing the metrology tool to perform a subsequent measurement on at least one wafer of a subsequent lot of wafers at one or more measurement locations of at least some of the fields of the sub-sampling scheme;
   calculating a second set of process tool correctables utilizing one or more results of the measurement performed utilizing the sub-sampling scheme, wherein a correctable is calculated for a respective field of the sub-sampling scheme; and
   approximating, with one or more wavelet functions, a process tool correctable for at least some of a set of unmeasured fields not included in the sub-sampling scheme of the at least one wafer of the subsequent lot of wafers utilizing the calculated second set of process tool correctables, wherein the sub-sampling scheme is configured to minimize a difference between the first set of correctables and a second set of correctables.

2. The computer implemented method of claim 1, wherein the sub-sampling scheme includes a sub-set of fields of the wafer of a lot of wafers.

3. The computer implemented method of claim 1, wherein the sub-sampling scheme includes a sub-set of measurement locations of measurement locations in at least some of the fields of the wafer of a lot of wafers.

4. The computer implemented method of claim 1, wherein the sub-sampling scheme includes at least one of an optimal sampling scheme, an enhanced sampling scheme, or a reduced sampling scheme.

5. The computer implemented method of claim 1, wherein the sub-sampling scheme is configured to minimize the difference between the first set of correctables and a second set of correctables calculated using the sub-sampling scheme.

6. The computer implemented method of claim 1, wherein the measuring a wafer of a first lot via an omniscient sampling process comprises:
    performing a metrology measurement on a wafer of a first lot via an omniscient sampling process.

7. The computer implemented method of claim 1, wherein the parameter value includes at least one of an overlay value, a critical dimension (CD) value, a focus value, or a dose value.

8. The computer implemented method of claim 1, wherein the calculated correctable for each field includes at least one of an overlay correctable, a dose correctable, or a focus correctable.

9. The computer implemented method of claim 1, wherein the process tool correctable signature includes a wafer-level non-uniform spatial pattern created by a combination of the process tool correctables calculated for at least some of the fields of the wafer of the first lot of wafers.

10. The computer implemented method of claim 1, wherein the results of the measurement on the wafer of the first lot include information indicative of variation in the measurement.

11. A computer implemented method for providing process tool correctables, comprising:
    performing, with a metrology tool, a first measurement on a wafer of a first lot of wafers via an omniscient sampling process, wherein the omniscient sampling process includes measuring one or more parameter values at one or more measurement locations of at least some fields of the first wafer;
    calculating a first set of process tool correctables utilizing one or more results of the measurement performed via an omniscient sampling process, wherein a correctable is calculated for a respective field of the wafer of the first lot of wafers;
    randomly selecting a set of field sampling locations of the wafer of the first lot of wafers, wherein the number of fields to be sampled is preselected;
    calculating a second set of process tool correctables by applying an interpolation process to the randomly selected set of field sampling locations, wherein the interpolation process utilizes values from the first set of process tool correctables for the randomly selected set of field sampling locations in order to calculate process tool correctables for unmeasured fields of the wafer of the first lot of wafers not included in the set of randomly selected fields;
    determining a sub-sampling scheme by calculating a difference between the first set of process tool correctables and the second set of process tool correctables, wherein the sub-sampling scheme is configured to minimize the difference between the first set of process tool correctables and the second set of process tool correctables, wherein the sub-sampling scheme includes a set of field locations of the wafer and a set of measurement locations within at least some of the fields of the wafer, wherein the number of field locations of the sub-sampling scheme is less the number of field locations measured in the omniscient sampling process;
    directing the metrology tool to perform a subsequent measurement on at least one wafer of a subsequent lot of wafers at one or more measurement locations of at least some of the fields of the sub-sampling scheme; and
    approximating, with one or more interpolation processes, a process tool correctable for at least some of a set of unmeasured fields not included in the sub-sampling scheme.

12. The computer implemented method of claim 11, wherein the approximating, with one or more interpolation processes, a process tool correctable for at least some of a set of unmeasured fields not included in the sub-sampling scheme comprises:
    performing a subsequent measurement on at least one wafer of a subsequent lot of wafers at one or more measurement locations of at least some of the fields of the sub-sampling scheme;
    calculating a third set of process tool correctables utilizing one or more results of the measurement performed utilizing the sub-sampling scheme, wherein at least one of the third set of process tool correctables is calculated for a respective field of the sub-sampling scheme; and
    approximating, with one or more interpolation processes, a process tool correctable for at least some of a set of unmeasured fields not included in the sub-sampling scheme of the at least one wafer of the subsequent lot utilizing the calculated third set of process tool correctables.

13. The computer implemented method of claim 11 wherein the determining a sub-sampling scheme comprises:
    determining a sub-sampling scheme by calculating a difference between the first set of process tool correctables and the second set of process tool correctables, wherein the sub-sampling scheme is configured to minimize the difference between the first set of process tool correctables and the second set of process tool correctables.

14. The computer implemented method of claim 11, wherein the interpolation process includes at least one of Spline interpolation process, polynomial interpolation process, or neural network interpolation process.

15. The computer implemented method of claim 11, wherein the randomly selecting a set of field sampling locations of the wafer of a first lot of wafers comprises:
    a Monte Carlo analysis process.

16. The computer implemented method of claim 11, wherein the randomly selecting a set of field sampling locations of the wafer of a first lot of wafers is repeated until a sub-sampling scheme is determined.

17. A system for providing process tool correctables, comprising:
    a measurement system configured to perform one or more measurements on a semiconductor wafer; and
    one or more computer systems including one or more processors configured to execute a set of program instructions configured to cause the one or more processors to:

calculate a first set of process tool correctables utilizing one or more results of an omniscient sampling process performed by the measurement system on a wafer of a first lot of wafers, wherein a correctable is calculated for at least some fields of the wafer of the first lot of wafers;

randomly select a set of field sampling locations of the wafer of the first lot of wafers, wherein the number of fields to be sampled is preselected;

calculate a second set of process tool correctables by applying an interpolation process to the randomly selected set of field sampling locations, wherein the interpolation process utilizes values from the first set of process tool correctables for the randomly selected set of field sampling locations in order to calculate process tool correctables for fields of the wafer of the first lot of wafers not included in the set of randomly selected fields;

determine a sub-sampling scheme by calculating a difference between the first set of process tool correctables and the second set of process tool correctables, wherein the sub-sampling scheme is configured to minimize a difference between the first set of process tool correctables and the second set of process tool correctables, wherein the sub-sampling scheme includes a set of field locations of the wafer and a set of measurement locations within at least some of the fields of the wafer, wherein the number of field locations of the sub-sampling scheme is less the number of field locations measured in the omniscient sampling process;

directing the measurement system to perform a subsequent measurement on at least one wafer of a subsequent lot of wafers at one or more measurement locations of at least some of the fields of the sub-sampling scheme.

18. The system of claim 17, wherein the measurement system includes a metrology system.

19. The system of claim 18, wherein the metrology system is configured to perform at least one of critical dimension metrology or overlay error metrology.

20. The system of claim 17, wherein the measurement system is configured to utilize the determined sub-sampling scheme.

21. The system of claim 17, wherein the one or more computer systems are further configured to:

calculate a third set of process tool correctables utilizing one or more results of a subsequent measurement performed utilizing the sub-sampling scheme, wherein at least one of the third set of process tool correctables is calculated for a respective field of the sub-sampling scheme; and approximating, with one or more interpolation processes, a process tool correctable for at least some of a set of unmeasured fields not included in the sub-sampling scheme of the at least one wafer of the subsequent lot utilizing the calculated third set of process tool correctables.

* * * * *